United States Patent
Klein et al.

(10) Patent No.: US 10,088,577 B2
(45) Date of Patent: Oct. 2, 2018

(54) MONITORING DEVICE, TERMINAL, AND MONITORING SYSTEM FOR MONITORING THE ENVIRONMENT

(75) Inventors: Rolf-Dieter Klein, Munich (DE);
Mathias Reichl, Kelheim (DE);
Christoph Hoeschen, Hebertshausen (DE)

(73) Assignees: HELMHOLTZ ZENTRUM MUENCHEN DEUTSCHES FORSCHUNGSZENTRUM FUER GESUNDHIET UND UMWELT (GMBH), Neuherberg (DE);
Rolf-Dieter Klein, Munich (DE);
Mathias Reichl, Kelheim (DE)

( * ) Notice: Subject to any disclaimer, the term of this patent is extended or adjusted under 35 U.S.C. 154(b) by 1077 days.

(21) Appl. No.: 14/353,518

(22) PCT Filed: Nov. 17, 2011

(86) PCT No.: PCT/EP2011/005795
§ 371 (c)(1),
(2), (4) Date: Nov. 12, 2014

(87) PCT Pub. No.: WO2013/060347
PCT Pub. Date: May 2, 2013

(65) Prior Publication Data
US 2015/0069219 A1  Mar. 12, 2015

(30) Foreign Application Priority Data

Oct. 24, 2011 (WO) .................. PCT/EP2011/005353

(51) Int. Cl.
*H01J 40/14*  (2006.01)
*G01T 1/00*  (2006.01)
(Continued)

(52) U.S. Cl.
CPC ................. *G01T 1/00* (2013.01); *G01C 11/00* (2013.01); *G01T 1/026* (2013.01); *G01T 1/18* (2013.01);
(Continued)

(58) Field of Classification Search
CPC .. G01T 1/00; G01T 1/026; G01T 1/18; G01T 1/24; G01T 1/2928; G01T 7/00; G01C 11/00; H01L 27/14601; H04W 4/005
See application file for complete search history.

(56) References Cited

U.S. PATENT DOCUMENTS 4,381,450 A  4/1983 Cappelli
7,391,028 B1  6/2008 Rubenstein
(Continued)

FOREIGN PATENT DOCUMENTS

DE  102009008025 A1  8/2010
DE  102009056055 A1  5/2011
(Continued)

OTHER PUBLICATIONS

Barzilov et al., "Network of wireless gamma ray sensors for radiological detection and identification", Proc. of SPIE, vol. 6540, pp. 654012-1-654012-8 (2007).
(Continued)

*Primary Examiner* — Kevin Pyo
(74) *Attorney, Agent, or Firm* — Caesar Rivise, PC (57) ABSTRACT

The invention relates to a monitoring device (6) for monitoring the environment, in particular for monitoring the environment for radioactive radiation, comprising at least one receiver for receiving measured values of an environmental variable that potentially poses a health hazard and comprising a computing unit (10) for computing a hazard warning (4.1-4.4) dependent on the measured values. The receiver is designed to receive the measured values from a
(Continued)

plurality of spatially distributed electronic terminals (2.1-2.4), in particular from mobile telephones with an image sensor for measuring the radioactive radiation. The invention further relates to a corresponding terminal (2.1-2.4) and to a complete monitoring system with a monitoring device and numerous terminals (2.1-2.4) for measuring the environmental variable.

20 Claims, 4 Drawing Sheets (51) Int. Cl.
| | |
|---|---|
| H04W 4/70 | (2018.01) |
| G01T 1/02 | (2006.01) |
| G01T 1/29 | (2006.01) |
| G01T 7/00 | (2006.01) |
| G01T 1/18 | (2006.01) |
| G01T 1/24 | (2006.01) |
| H01L 27/146 | (2006.01) |
| G01C 11/00 | (2006.01) |
| H04W 4/00 | (2018.01) |

(52) U.S. Cl.
CPC .............. *G01T 1/24* (2013.01); *G01T 1/2928* (2013.01); *G01T 7/00* (2013.01); *H01L 27/14601* (2013.01); *H04W 4/005* (2013.01); *H04W 4/70* (2018.02)

(56) References Cited

U.S. PATENT DOCUMENTS

| | | |
|---|---|---|
| 2004/0149918 A1 | 8/2004 | Craig et al. |
| 2009/0012745 A1 | 1/2009 | Longman et al. |

FOREIGN PATENT DOCUMENTS

| | | |
|---|---|---|
| EP | 0757474 A1 | 2/1997 |
| GB | 968189 | 8/1964 |
| WO | 2004079395 A2 | 9/2004 |
| WO | 2008110182 A1 | 9/2008 |
| WO | 2010083006 A2 | 7/2010 |
| WO | 2013060342 A1 | 5/2013 |
| WO | 2013060348 A1 | 5/2013 |

OTHER PUBLICATIONS

Dafinf GmbH, "BQSan zur Messung radioaktiver Strahlung mit Digitalkameras" (& English version: "BQScan—Measure Radioactivity using Digital Cameras"), May 2011 (May 2011).
Mukhopadhyay, "Field Deployable Gamma Radiation Detectors for DHS Use", Proc. of SPIE, vol. 6406, pp. 670612-1-670612-8 (2007).
Rubenstein et al., "Detection of Radioactivity in Transit Stations—Phase 2", Oct. 1, 2009 (Oct. 1, 2009), pp. 1-19, XP55031669.
Abstract of DE 10 2009 056055 (2009).
Abstract of DE 10 2009 008025 (2010).
International Search Report for PCT/EP2011/005795 dated Jan. 30, 2013.

MONITORING DEVICE, TERMINAL, AND MONITORING SYSTEM FOR MONITORING THE ENVIRONMENT

BACKGROUND OF THE INVENTION

The invention concerns a monitoring installation for environmental monitoring, in particular for environmental monitoring of radioactive radiation. Furthermore, the invention concerns a terminal unit for providing measurement data for the monitoring installation according to the invention. In addition, the invention also comprises a monitoring system with numerous such terminal units and a central monitoring installation.

In Germany the German Bundesamt für Strahlenschutz (Federal office for radiation protection) operates a so-called ODL measurement network (ODL: Orts-Dosisleistung=local dose rate), which measures by means of a plurality of widely distributed measurement points the local dose rate of the gamma radiation at the respective measurement location, wherein the measured values of the individual measurement points are transmitted wired via the telephone network to a measurement network node (evaluation unit). The measurement network node can then calculate from the plurality of measured values from the different measurement points a radiation map, which reflects the geographical distribution of the local dose rate.

The disadvantages of this known ODL measurement network consist in the high infrastructure expenditure for the provision and the operation of the plurality of measurement points as well as the high costs for high requirements with respect to spatially resolved insights on the distribution of the radioactive radiation.

DESCRIPTION OF THE INVENTION

Therefore, the invention is based on the object of creating a corresponding monitoring system with a significantly lower infrastructure expenditure.

This object is solved by a monitoring installation (evaluation unit), in accordance with adapted terminal units (measurement points) and a monitoring system according to the claims.

The invention is based upon the technical-physical insight that radioactive radiation can be measured not only by radiation sensors (e.g. Geiger-Müller counter tubes) specially designed for this purpose, but rather also by conventional image sensors (e.g. CCD sensors, CMOS sensors), which are included in digital cameras of modern terminal units (e.g. mobile phones, notebooks, laptops, etc.). The invention therefore provides that such image sensors in modern terminal units are also used for radiation measurement, which allows the establishment of a measurement network with a very low infrastructure expenditure, since the expenditure for the provision and the operation of the individual measurement points is not applicable. Furthermore, this technical thought allows the establishment of a very dense measurement network, since in Germany, for example, several million mobile phones are operated, which have an image sensor and are therefore suitable for radiation measurement. Due to the plurality of terminal units used for radiation measurements, there is furthermore the advantageous option of statistical evaluation of the plurality of measured values, whereby the accuracy can be clearly increased.

The invention therefore comprises at first a central monitoring installation similar to the measurement network node of the known ODL measurement network. This central monitoring installation has a receiver for the reception of measured values of an environmental variable that is potentially hazardous to health, wherein it is preferably a radiation value, which reflects the radioactive radiation.

The invention is, however, not restricted to monitoring of radioactive radiation with respect to the monitored environmental variable, but rather can fundamentally also be used for monitoring of other environmental variables, which are potentially hazardous to health. For example, the monitored environmental variable can be pollutant concentrations. It is merely decisive that the interesting environmental variable can be measured by the terminal unit.

Furthermore, the monitoring installation according to the invention has a computing unit for calculation of a hazard warning depending on the measured values.

The monitoring installation according to the invention differs from the network nodes of the known ODL measurement network by the fact that the receiver is designed for the reception of the measured values of a plurality of spatially distributed electronic terminal units (e.g. mobile phones with an image sensor for measurement of the radioactive radiation), whereas the network nodes of the ODL measurement network receive the measured values from fixed measurement points.

The reception of the measured values from the individual terminal units preferably takes place in a wireless manner, for example via a cellular mobile network. It is, however, within the context of the invention, basically also possible to transmit the measured values from the individual terminal units by wire to the monitoring installation or via a radio connection. Preferably, however, a transmitter is used in the terminal units for transmission of the measured values from the individual terminal units to the central monitoring installation, which transmitter is anyway available to execute the normal function of the terminal unit, so that conventional terminal units are suitable within the context of the invention.

Furthermore, the monitoring installation according to the invention preferably also has a transmitter in order to transmit a hazard warning to the electronic terminal units, wherein the hazard warning informs the users of the terminal units about a possible health hazard due to the measured values of the environmental variable. In contrast to the conventional ODL measurement network described at the beginning, there is therefore for the invention preferably a bidirectional communication between the individual terminal units on the one hand and the monitoring installation on the other hand.

The above-mentioned hazard warning for the users of the terminal units is preferably calculated within the context of the invention depending on the geographical position of the individual terminal units. This means that the users of the terminal units receive different hazard warnings depending on their actual geographical position. If, for example, a user of a terminal unit is located in an area with high radiation, the hazard warning can instruct the user to leave the hazardous area as quickly as possible. If, in contrast, a user of a terminal unit is located in an area with low and health safe radiation values, the hazard warning can inform the user about the safety of a further stay in this area and thereby avoid panic.

In a variant of the invention, the geographical position of the individual terminal units is each determined by the individual terminal units, wherefore an integrated GPS module (GPS: Global Positioning System) can be used for modern mobile phones. The geographical position of the individual terminal units is then transmitted by the individual terminal units together with the respective measured value of the monitored environmental variable to the monitoring installation. It should be mentioned here that the geographical position of the individual terminal unit can be determined not only through a GPS module, but rather also through another satellite navigation system, such as the Galileo system.

In another variant of the invention, the geographical position of the individual terminal units is, in contrast, not determined by the terminal units themselves, but rather by the monitoring installation. This offers the advantage that also the geographical position of such terminal units can be determined, which have no integrated GPS module.

For a cellular mobile network, the geographical position of the individual terminal units can, for example, be determined through cell localization of the radio cell of the respective terminal unit in the cellular mobile network. This cell localization can be carried out in the mobile radio device or in the central monitoring installation.

A further option for determining the geographical position of the individual terminal unit consists in the fact that, for a WLAN connection (WLAN: Wireless Local Area Network) of the terminal units, the associated Wireless Access Point is localized, the geographical position of which then approximately matches the position of the respective terminal unit.

Furthermore, the monitoring installation according to the invention preferably comprises a geo-database, which contains geographical data of a geographical area, in which the terminal units are located.

For example, terrain data can be stored in the geo-database, which are relevant for the attenuation of radioactive radiation. If, for example, a radiation source is located in a valley, the radioactive radiation originating from the radiation source is attenuated by surrounding mountains.

Furthermore, the geo-database can also contain data on traffic routes (e.g. roads, railways, etc.) in order to inform the user of the terminal units within the context of hazard warnings about optimal traffic routes for a flight.

Furthermore, the geo-database can also contain information about building data (e.g. positions of protection installations, such as civil defense bunkers) in order to direct the users of the terminal units within the context of hazard warnings to certain safety devices.

The computing unit in the central monitoring installation then calculates the hazard warning not only depending on the measured values of the monitored environmental variable received in the individual terminal units, but rather also depending on the geographical data stored in the geo-database.

In a preferred exemplary embodiment of the invention, the computing unit in the central monitoring installation calculates a spatial distribution of a radiation exposure depending on the measured values received from the terminal units, taking into account the geographical data stored in the geo-database and also taking into account the geographical position of the individual terminal units. In this manner, the monitoring installation can create a very exact radiation map of the monitored area, wherein the radiation map can, for example, reproduce the geographical distribution of the local dose rate in the monitored area.

In the preferred exemplary embodiment of the invention, the monitoring installation has a statistics unit in order to statistically evaluate the measured values of the environmental variable and the associated geographical position of the terminal units measured by the terminal units.

Within the context of statistical evaluation, for example, outliers of the measured values can be determined, so that the outliers are note taken into consideration for further evaluation and thus do not falsify.

It should also be mentioned that the terminal units are generally not designed for application as radiation measurement devices and therefore output only a relatively inaccurate, not calibrated measured value. However, for example, the CCD sensors (CCD: Charge-Coupled Device) or CMOS sensors (CMOS: Complementary Metal Oxide Semiconductor) present as image sensors in the terminal units have due to their construction and design a certain characteristic form, which does not vary between the terminal units, so that a statistical evaluation of the plurality of measured values allows for an extreme accurate determination of the environmental variable. For this evaluation, one can, for example, use a reconstruction algorithm, such as the so-called "Filtered Back Projection" algorithm or the OPED algorithm (OPED: Orthogonal Polynomial Expansion on the Disc) or any iterative reconstruction algorithm. These reconstruction algorithms are per se known from the prior art and must therefore not be described in more detail.

It is also conceivable within the context of the invention to use a microphone for radiation measurement.

Within the context of the statistical evaluation of the plurality of measured values, the statistics unit can also perform smoothing of the measured values and/or calculate an average value of the measured values. Furthermore, there is the option within the context of the invention that the statistics unit subjects the measured values of the environmental variable measured by the terminal units to a plausibility check.

It has already been mentioned above that the central monitoring installation transmits a hazard warning to the individual terminal units, wherein the hazard warning can, for example, contain a flight recommendation in order to give the users of the terminal units the opportunity to escape as fast as possible from a hazardous area. For example, the flight recommendation can be a recommended flight direction, a recommended means of transport (e.g. motor vehicle, railway, by feet) and/or a recommendation of a certain traffic route (e.g. avoiding highways). Furthermore, there is within the context of the invention the option that the hazard warning indicates a certain flight destination in order to direct the users of the terminal units, for example, to a shelter. Furthermore, there is also the option that the alarm message contains a quantitative and/or qualitative information about the environmental variable at the respective location of the respective terminal unit.

When calculating the hazard warning in the monitoring installation, weather reports can also be taken into account, which predict the weather in the monitored area. This is meaningful, since, for example, radiation clouds spread out in accordance with the respective weather in the monitored area and apply different precipitations of radionuclides in increased concentration to relevant areas.

In addition, there is also the option that traffic messages on the traffic in the monitored area are taken into account for the calculation of the hazard warning. So, for example, flight recommendations can be calculated so that traffic jams are prevented whenever possible.

With respect to the communication between the individual terminal units and the central monitoring installation, there are different options within the context of the invention.

An option provides that the central monitoring installation actively queries the terminal units ("polling"), whereupon the terminal units then transmit the measured value of the environmental variable and, if necessary, the above-described further values (e.g. position) to the monitoring installation.

Another option provides, in contrast, that the terminal units actively transmit the measured value of the environmental variable and, if necessary, also the above-described further values (e.g. position) to the monitoring installation, for example, when the measured value of the environmental variable exceeds a limit value.

It should also be mentioned that the invention not only claims protection for the above-described central monitoring installation, but rather also for a correspondingly adapted terminal unit (e.g. communication terminal unit, mobile phone, laptop, netbook, notebook, etc.), which has a sensor, which is suitable for measurement of the environmental variable and is able to then transmit the measured value by means of a transmitter to the monitoring installation. For the measurement of radioactive radiation, one can, for example, use an image sensor (e.g. CCD sensor, CMOS sensor), which is present anyway in modern mobile phones and portable computers and can therefore also be used for radiation measurement. The adaptation of the terminal unit used for purpose the according to the invention can optionally be carried out at the software (e.g. with a suitable application program) and/or at the hardware level.

When using a conventional image sensor for radiation measurement, a statistical evaluation of the output signals of the individual image elements of the image sensor is performed, wherein the spatial resolution required for image capture is lost, but thereby a relatively exact measured value can be obtained.

When using an image sensor for radiation measurement, the image sensor is preferably covered during the measurement of the ionizing radiation by a cover, wherein the cover is impermeable for visible light, whereas the cover is translucent for radioactive radiation. This ensures that the radiation measurement is not disturbed by incident visible light.

It should also be mentioned that the mobile phones preferably used as terminal units nowadays usually have a program memory, in which application programs ("apps") can be stored. These application programs can then be run by a processor in the respective terminal unit (e.g. mobile phone). The invention now provides that an application program is stored in the program memory, which application program carries out the entry of measured values according to the invention and the data communication.

It must be taken into account here that the measured value of the radioactive radiation also depends on the spatial orientation of the digital camera used as radiation sensor. If, for example, the digital camera of the mobile phone is directly oriented onto the radiation source, a higher radiation value is then measured as when the digital camera is facing away from the radiation source resp. when an obstacle (e.g. the user) is between the digital camera and the radiation source. The application program therefore preferably measures the measured value of the environmental variable iteratively in several iteration steps with different spatial orientations of the terminal unit. A measured value is measured in the individual iteration steps, wherein, between the individual iteration steps, a direction recommendation is determined, which is displayed to the user of the terminal unit and causes the user to align the terminal unit for the measurement in a certain direction in accordance with the direction recommendation. The iteration is then preferably repeated until the orientation of the terminal unit has led to a maximum measured value, which is then transmitted to the central monitoring installation.

Finally, it should be mentioned that the invention also comprises a complete monitoring system with the above-described central monitoring installation and a plurality of electronic terminal units for measurement of the monitored environmental variable.

In such a monitoring system, a direct data connection can be provided for between the individual terminal units, in particular in the form of a Bluetooth connection or a WLAN connection.

On the one hand, this direct data connection between the individual terminal units can be used in order to enable network access in a mobile network to a mobile phone via a detour. If therefore a mobile phone has no direct network access, this mobile phone can first establish a connection to another terminal unit and then transmit the measured value and the above-described further information with this detour to the central monitoring installation.

On the other hand, the direct connection between two terminal units, however, also allows a calibration of the terminal units as well as the comparison of a measured radiation value with the value of the reconstructed radiation map.

It should also be mentioned that the invention also comprises corresponding operating methods for the individual terminal units and for the central monitoring installation, as can already be seen from the above description.

BRIEF DESCRIPTION OF THE DRAWINGS

Other advantageous further developments of the invention are explained in greater detail below with reference to the figures together with the description of the preferred exemplary embodiments of the invention. The figures show as follows.

Figure 1:
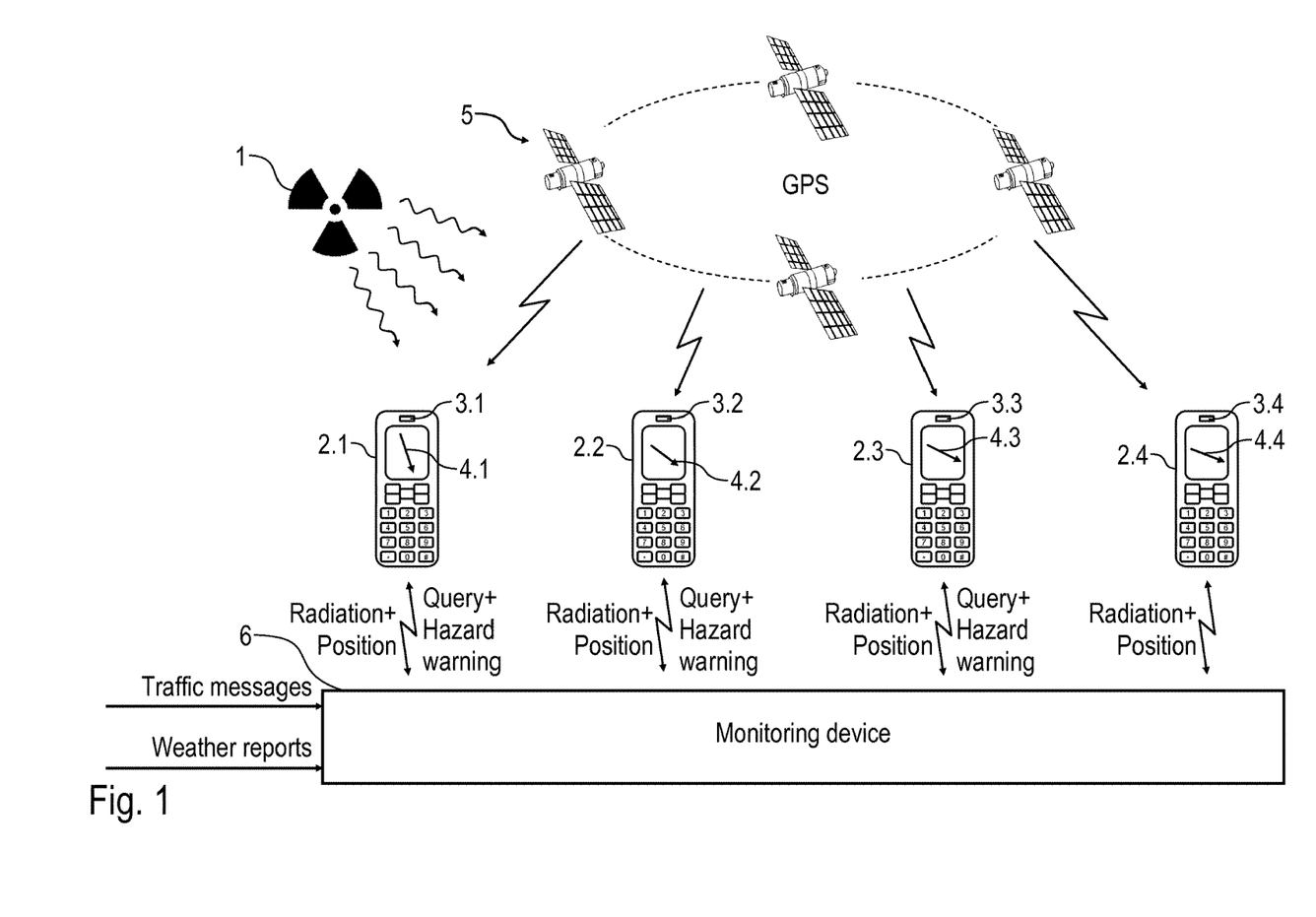
FIG. 1 a schematic representation of a monitoring system for monitoring of radioactive radiation with a central monitoring installation and a plurality of terminal units for radiation measurement, FIG. 2 a schematic representation of the monitoring installation from FIG. 1, FIGS. 3A and 3B the operating method of the terminal units from FIG. 1 in the form of a flow chart.

FIG. 1 shows schematically a monitoring system according to the invention for wide-area radiation monitoring, wherein the monitoring system allows, for example, the detection of a so-called dirty bomb 1 and also allows the determination of the geographical position of the dirty bomb 1. The monitoring system according to the invention is, however, also suitable for determination of the intensity and the geographical position other radiation sources, such as of radiation clouds, which result from incidents in nuclear systems.

For radiation measurement, the monitoring system according to the invention uses conventional mobile phones 2.1-2.4, which are available anyway in very large numbers and good spatial distribution in the monitored area. The high number of the mobile phones 2.1-2.4 used for radiation measurement and the good spatial distribution ensure that a plurality of measured values can be provided, which allows within the context of statistical evaluation a very exact determination of the spatial distribution of the radiation values. The ODL measurement network in Germany described at the beginning thus has only less than 3000 measurement points, whereas in Germany several million mobile phones are being used, which include a digital camera and can therefore be used within the context of the monitoring system according to the invention also for radiation measurement, especially as there is at focal points (e.g. stadiums, airports) such density of the mobile phones 2.1-2.4 that a local hazard detection is possible.

The mobile phones 2.1-2.4 thus each have a digital camera 3.1-3.4, which each contains an image sensor (e.g. CCD sensor, CMOS sensor), which is not only sensitive to visible light, but rather also to radioactive radiation and can therefore be used for radiation measurement.

Furthermore, the individual mobile phones 2.1-2.4 each have a display, on which a hazard warning 4.1-4.4 can be displayed, wherein the hazard warning will be explained in more detail below.

Furthermore, the individual mobile phones 2.1-2.4 each have an integrated GPS module (GPS: Global Positioning System) for determination of the geographical position of the respective mobile phone 2.1-2.4 by means of a satellite-based GPS system 5, which is represented here only schematically and is per se known from the prior art, so that there is no need for a description of the mode of operation of the GPS system 5.

The individual mobile phones 2.1-2.4 measure by means of the digital cameras 3.1-3.4 a radiation value at the location of the respective mobile phone 2.1-2.4. Furthermore, the individual mobile phones 2.1-2.4 detect by means of the integrated GPS module the respective geographical position of the mobile phone 2.1-2.4.

The measured value of the radiation value is then transmitted together with the geographical position of the individual mobile phones 2.1-2.4 to a central monitoring installation 6, which creates a radiation map based on the incoming measured value of the plurality of mobile phones 2.1-2.4, which map reflects the geographical distribution of the radiation value in the monitored area.

The monitoring installation 6 then determines by means of the radiation map, while taking into account the received traffic messages and weather reports, the hazard warnings 4.1, 4.4 already mentioned above, which can include, for example, a flight recommendation, as is indicated by the arrows in the drawing, wherein this calculation can alternatively also be carried out in the mobile phones 2.1-2.4. Furthermore, the hazard warnings that are transmitted from the monitoring installation to the terminal units 2.1-2.4 also contain information about the geographical position of the dirty bomb 1 or about the intensity of the radiation at the location of the respective mobile phone 2.1-2.4.

Figure 2:
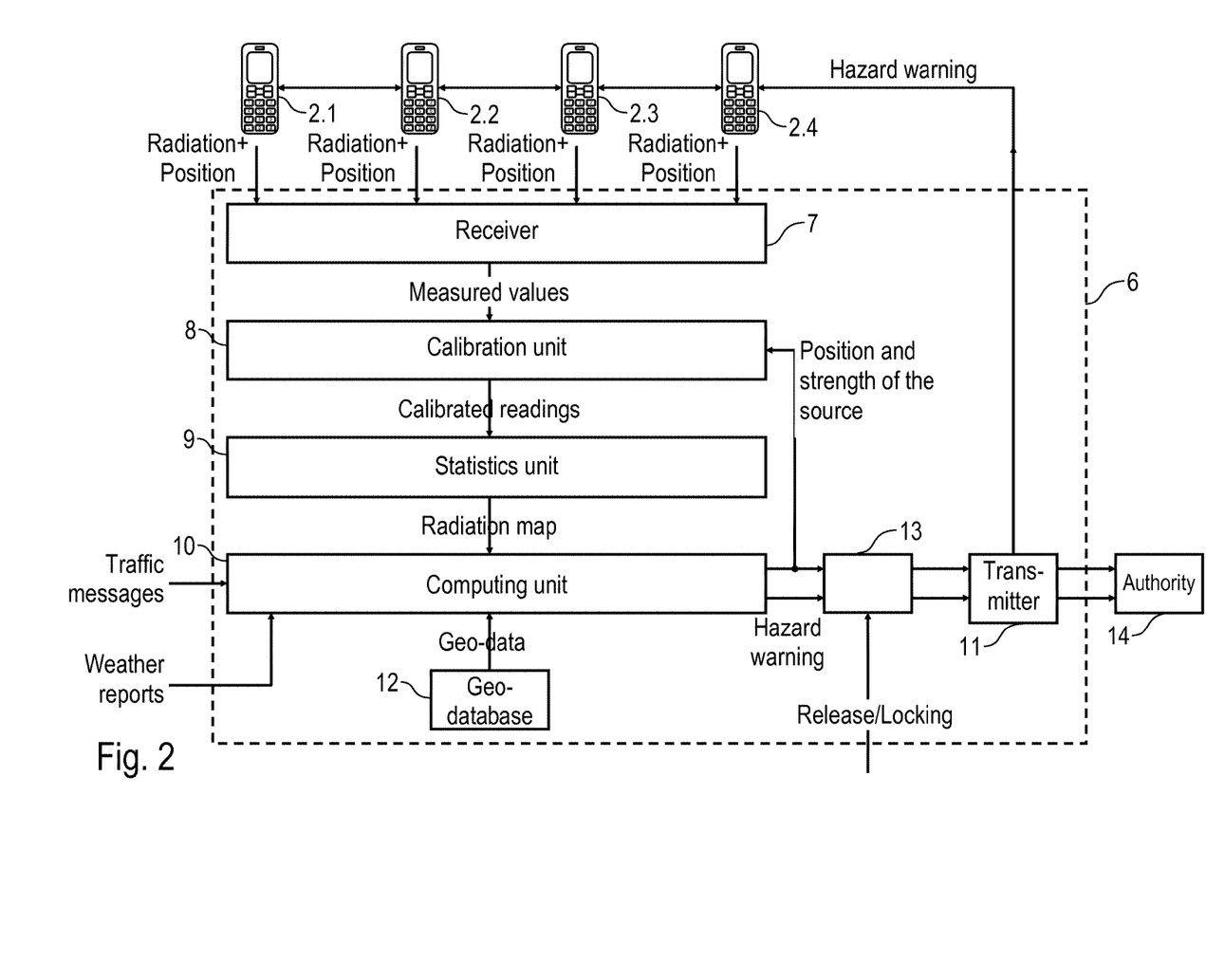

FIG. 2 shows schematically the structure and the mode of operation of the central monitoring installation 6 from FIG. 1.

The monitoring installation 6 thus has at first a receiver 7, wherein the receiver 7 receives from the mobile phones 2.1-2.4 the respective measured values of the radioactive radiation and the respective geographical position of the respective mobile phone 2.1-2.4.

Furthermore, the monitoring installation 6 contains a calibration unit 8 in order to calibrate the incoming measured values of the radioactive radiation. It should be mentioned here that the individual mobile phones 2.1-2.4 are not calibrated with respect to the radiation measurement and therefore transmit only relatively inaccurate, not calibrated measured values to the transmission device 6. However, the digital cameras 3.1-3.4 used for radiation measurement each have image sensors with a uniform sensor characteristic, wherein the sensor characteristic depends on the construction and design. The uniformity of the sensor characteristics in the different mobile phones 2.1-2.4 can be used in the calibration unit 8 by a reconstruction algorithm (e.g. "Orthogonal Polynomial Expansion on Disc", OPED) in order to calibrate the measured value.

Furthermore, the monitoring installation 6 has a statistics unit 9 in order to statistically evaluate the calibrated measured value. Within the context of statistical evaluation in the statistics unit 9, for example, outliers of the measured values can be eliminated and, beyond this, average values of the numerous measured values can be made for example. The statistics unit 9 then outputs a radiation map to a computing unit 10, wherein the radiation map reflects the geographical distribution of the measured radiation values (e.g. local dose rate).

The computing unit then calculates, depending on the radiation map, the position and the strength of the dirty bomb 1 in order to be able to locate the dirty bomb 1. Furthermore, the determined position and strength of the dirty bomb 1 are reported back to the calibration unit 8 in order to optimize the calibration.

Furthermore, the computing unit 10 calculates based on the radiation map, while taking into account the traffic messages and weather reports, a hazard warning, which is transmitted from a transmitter 11 to the mobile phones 2.1-2.4 in order to inform the users of the mobile phones 2.1-2.4 about a possible hazard.

When calculating the hazard warning, the computing unit 10 also takes into account geographical data (e.g. terrain data, building data, etc.), which are stored in a geo-database 12. Thus, for example, terrain formations (e.g. mountains) can lead to a local attenuation of the radiation values, which should be taken into account when determining the hazard warning.

Furthermore, the geo-database 12 can, for example, also contain building data, such as the position of shelters for the population, so that the computing unit 10 can then output appropriate flight recommendations to the users of the mobile phones 2.1-2.4.

Between the computing unit 10 and the transmitter 11, a release element 13 is in this case arranged, which allows to optionally release or to lock the output of the hazard warning and the information about the position and strength of the dirty bomb 1 in order to, for example, avoid panic in the population.

It should furthermore be mentioned that the transmitter 11 also forwards the hazard warning and the position and strength of the dirty bomb 1 to authorities 14 in order to be able to take measures against the dirty bomb 1.

Figure 3A:
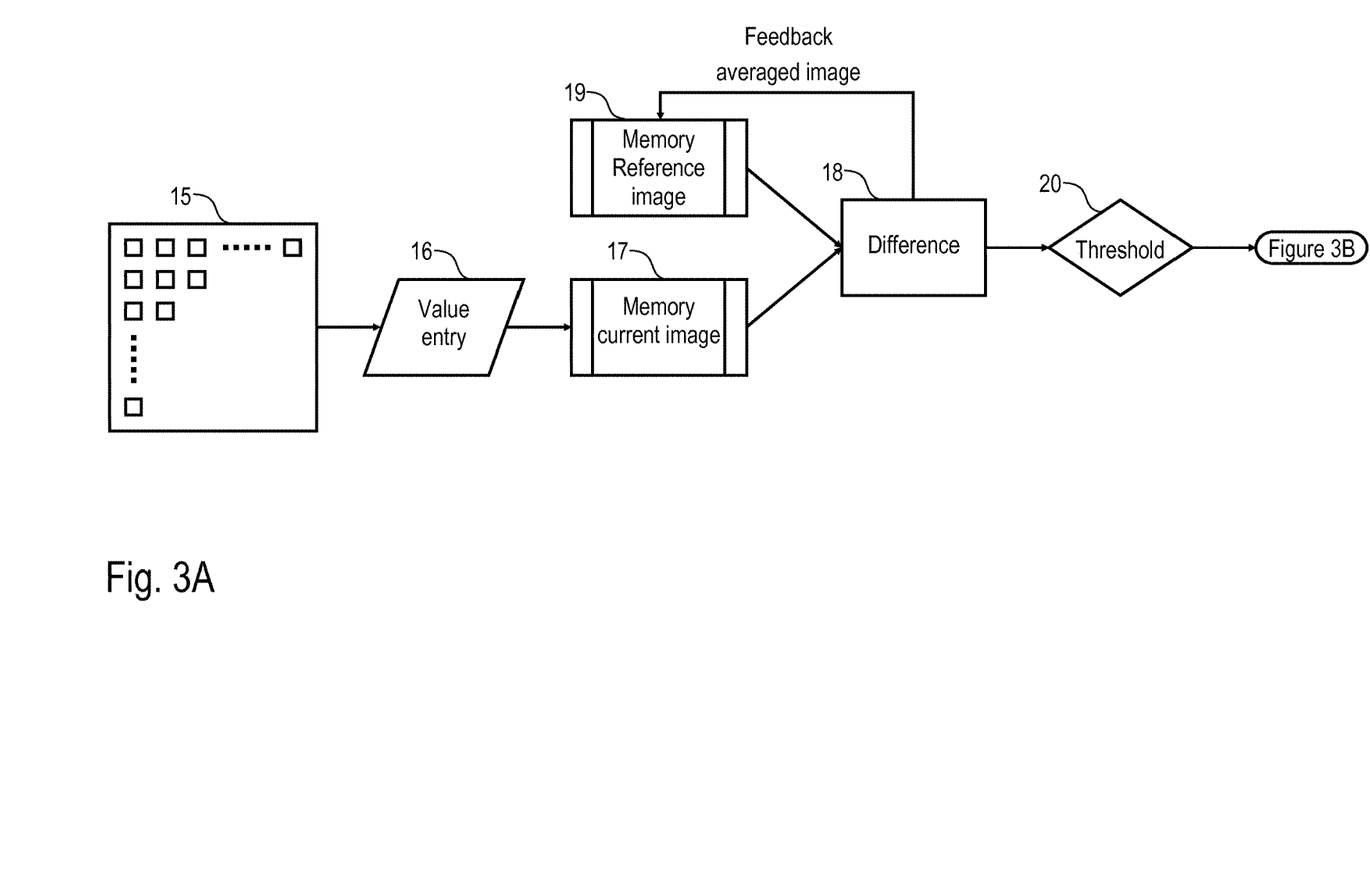
Figure 3B:
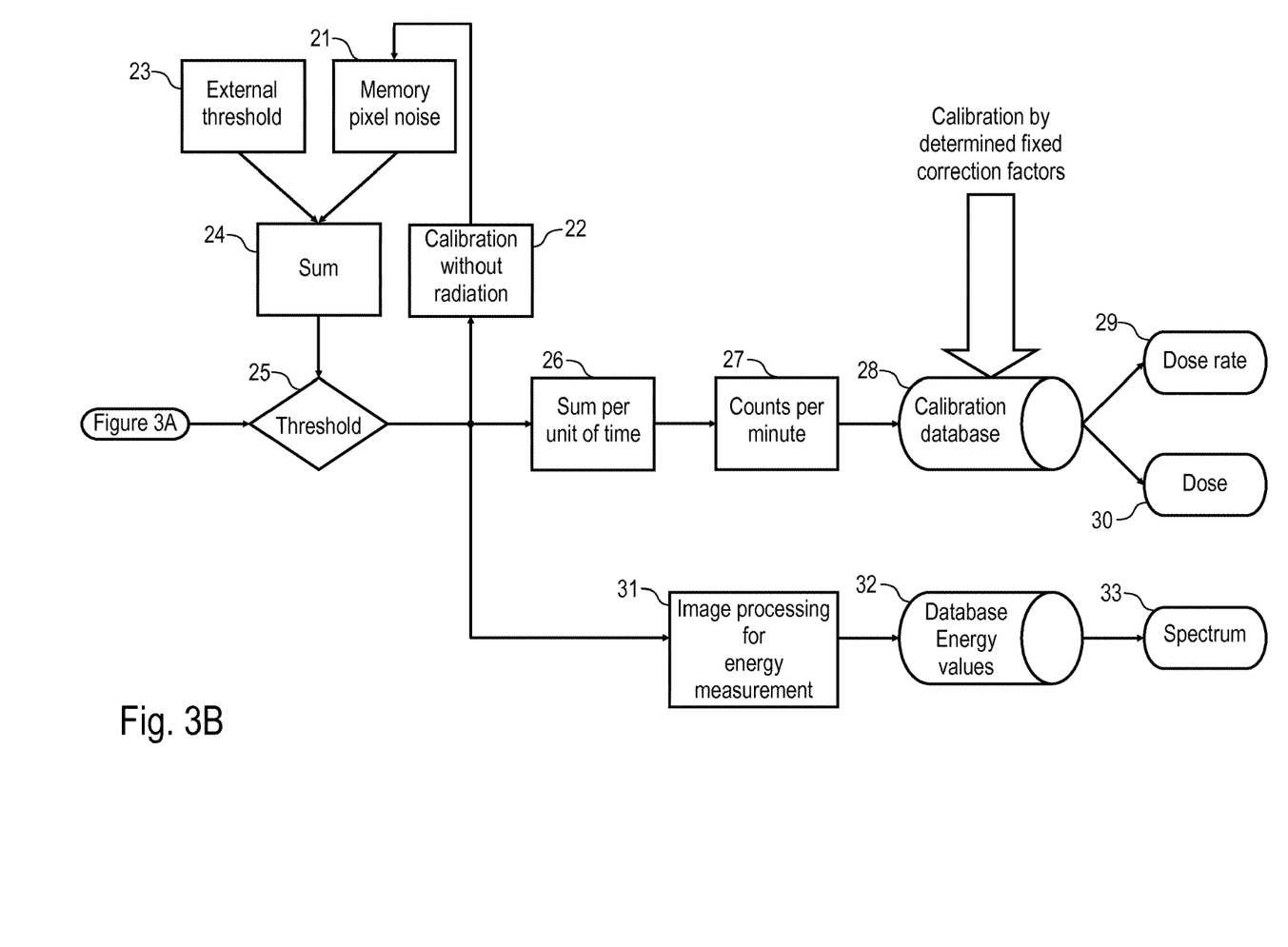

The FIGS. 3A and 3B show the operating method according to the invention for the mobile phones 2.1-2.4 in the form of a flow chart.

At first, the drawings show an image sensor 15 with numerous image elements arranged in the form of a matrix for radiation measurement. The image sensor 15 can, for example, be a CCD sensor or a CMOS sensor.

A step 16 comprises a value entry of the images measured by the image sensor 15 with a frame rate of 40-60 fps (frames per second). Alternatively, a frame rate of 15-24 fps is, for example, also possible. Optionally, single images are also possible, then if necessary with shutter times, which correspond to partial image capturing, or conversely time exposures with pretty large shutter times.

The measured images are then stored in a step 17 in an image memory.

Subsequently, in a step 18, a differentiation takes place between the actual image stored in step 17 and a reference image stored in a step 19, wherein a reference memory contains an average brightness per image element (pixel)

from the previous captured images. The thus reached averaging can take place depending on the actual difference, for example according to the following formula:

$$Ref = Ref \cdot n + \text{new pixel} \cdot m/(n+m)$$

with
Ref: brightness of the reference image
n: weighting factor for taking into account the reference image with n+m=1
m: weighting factor for taking into account the new image with n+m=1
new pixel: brightness of the new image The difference thus determined is then compared in a step 20 with an upper limit value and a lower limit value, wherein a counting event is triggered when the measured difference value lies between the upper limit value and the lower limit value.

Optionally, there is the option of a memory 21 for pixel noise represented in FIG. 3B, which is filled for a calibration process 22 with the noise values per pixel. To do so, several measurements are carried out in the dark and without any additional radiation. The individual differences between the current image and the last image are added up with a matrix (noise values per pixel) and then e.g. maximum values resp., after statistical evaluation, the determined values are saved (Gaussian distribution taking into account the incident background radiation). Furthermore, an external threshold 23 can be added, which is added up to the pixel threshold from the memory 21 in a step 24, which provides for more stable results.

A threshold value comparison 25 then provides an analogue or digital signal when threshold values are exceeded resp.—in case of negative sign—fallen short of. In a step 26, re the counting events are then added up over a certain unit of time.

Thereupon, in a step 27, the number of counting events (counts) is calculated per minute.

Via a calibration table 28, the assignment to a dose rate (e.g. based on the counts per minute) resp. dose (from the total number of counts) is then created. The calibration table can be created for a group of sensors or created individually through a measurement process with calibrated radiation source. Optionally, a correction factor can be provided for simplified calibration with one or two points.

As a result, in a step 29, a dose rate and, in a step 30, a dose is then output.

Furthermore, there is also the option for an image processing 31 for determining the energy value of the incident photons. Thus, low-energy photons generally trigger only a counting event in a single image element of the image sensor 6. High-energy photons lead in contrast to a crosstalk between neighboring image elements of the image sensor 6, so that a group (cluster) of several neighboring image elements of the image sensor 6 trigger a counting event. Through the image processing 31, such groups of activated image elements can then be determined, whereby a spectral distribution can be calculated in an approximate manner. The values thus obtained are compared with a data base 32 of the energy values, whereupon a spectrum of the incident radiation is then output in a step 33.

The invention is not limited to the preferred exemplary embodiments described above. Instead, a plurality of variants and modifications are possible, which also make use of the concept of the invention and thus fall within the scope of protection. Furthermore, the invention also claims protection for the subject-matter and the features of the subclaims independently of the claims to which they refer.

| List of reference signs: | |
|---|---|
| 1 | Dirty bomb |
| 2.1 | Mobile phone |
| 2.2 | Mobile phone |
| 2.3 | Mobile phone |
| 2.4 | Mobile phone |
| 3.1 | Digital camera |
| 3.2 | Digital camera |
| 3.3 | Digital camera |
| 3.4 | Digital camera |
| 4.1 | Hazard warning |
| 4.2 | Hazard warning |
| 4.3 | Hazard warning |
| 4.4 | Hazard warning |
| 5 | GPS system |
| 6 | Monitoring installation |
| 7 | Receiver |
| 8 | Calibration unit |
| 9 | Statistics unit |
| 10 | Computing unit |
| 11 | Transmitter |
| 12 | Geo-database |
| 13 | Release element |
| 14 | Authorities |
| 15 | Image sensor |
| 16 | Step "Value entry" |
| 17 | Step "Save" |
| 18 | Step "Differencing" |
| 19 | Step "Reference image" |
| 20 | Step "Threshold value testing" |
| 21 | Memory for pixel noise |
| 22 | Calibration process |
| 23 | External threshold |
| 24 | Step "Summation" |
| 25 | Threshold value comparison |
| 26 | Step "Summing-up per unit of time" |
| 27 | Step "Counts per minute" |
| 28 | Calibration table |
| 29 | Output Dose rate |
| 30 | Output Dosage |
| 31 | Image processing |
| 32 | Database of the energy values |
| 33 | Output Spectrum |

The invention claimed is:

1. A monitoring installation for environmental monitoring, comprising:
at least one receiver adapted to receive a measured values of an environmental variable that is potentially hazardous to health, the receiver intentionally designed for reception of the measured values from a pluality of electronic terminal units arranged spatially in a distributed manner, the environmental variable measured by the electronic terminal units including a radiation value that reflects a radioactive radiation;
a geo-database having geographical data of a geographical area, the geographical data saved in the geo-database including three-dimensional terrain data and three-dimensional building structure data that has an effect on an attenuation of the radioactive radiation; and
a computing unit configured to calculate a hazard warning depending on the measured values from t electronic terminal units and the geographical data saved in the geo-database, the hazard warning transmitted to one of the electronic terminal units including a flight recommendation with a recommendation of at least one of a flight direction, a type of transport, a traffic route, and a flight destination, the computing unit further configured to calculate a spatial distribution of a radiation exposure depending on the geographical data saved in the geo-database, the measured values of the radiation value measured by the electronic terminal units, and the geographical position of the electronic terminal units.

2. The monitoring installation according to claim 1, wherein the terminal units are mobile phones with a sensor for measurement of the radioactive radiation.

3. The monitoring installation according to claim 2, wherein the sensor of the terminal units is an image sensor.

4. The monitoring installation according to claim 1, further comprising a transmitter for the transmission of the hazard warning to the electronic terminal units, wherein the hazard warning informs users of the terminal units about a possible hazard to health due to the measured values of the environmental variable.

5. The monitoring installation according to claim 1, wherein the computing unit calculates the hazard warning depending on a geographical position of individual terminal units.

6. The monitoring installation according to claim 5, wherein the geographical position of each of the individual terminal units is determined by the individual terminal units by use of a satellite navigation system, and is transmitted, in addition to the measured value of the environmental variable, to the monitoring installation.

7. The monitoring installation according to claim 5, wherein the monitoring installation determines the geographical position of the individual terminal units by at least one of the following:
   a) a cell localization of a radio cell of a respective terminal unit in a cellular mobile network, and
   b) a localization of associated Wireless Access Points for a WLAN connection of the terminal units.

8. The monitoring installation according to claim 1, wherein
   a) the monitoring installation has a statistics unit for statistical evaluation of the measured values of the environmental variable measured by the terminal units and the associated geographical position of the terminal units, and/or
   b) the statistics unit statistically smoothes the measured values of the environmental variable measured by the terminal unit, and
   c) the statistics unit calculates an average value from the measured values measured by the terminal units, and
   d) the statistics unit subjects the measured values of the environmental variable measured by the terminal unit to a plausibility check, and
   e) the statistics unit determines outliers from the measured values measured by the terminal units and does not take the outliers into account during further evaluation.

9. The monitoring installation according to claim 1, wherein the hazard warning transmitted to the terminal unit
   b) includes an alarm message with quantitative and/or qualitative information about the environmental variable.

10. The monitoring installation according to claim 1, wherein the computing unit calculates the hazard warning depending on at least one of the following types of information:
   a) weather reports on the weather in an area in which the terminal units are located, and
   b) traffic messages on the traffic in an area in which the terminal units are located.

11. The monitoring installation according to claim 1, wherein
   a) the environmental variable measured by the terminal units is a radiation value, which reflects a radioactive radiation, which originates from a radiation source, and
   b) the computing unit calculates, based on the geographical position of the terminal units and the measured values of the radiation value measured by the terminal units, the geographical position of the radiation source.

12. The monitoring installation according to claim 1, wherein
   a) the measured values are distributed irregularly, and
   b) a reconstruction algorithm comprises one of the following reconstruction algorithms:
      b1) filtered back projection,
      b2) Orthogonal Polynomial Expansion on the Disc, or
      b3) an iterative reconstruction algorithm.

13. The monitoring installation according to claim 1, wherein the monitoring installation actively queries the terminal units, wherein the terminal units, in the event of any query by the monitoring installation, transmit the measured value of the environmental variable to the monitoring installation.

14. The monitoring installation according to claim 1, wherein the terminal units transmit the measured value of the environmental variable actively to the monitoring installation.

15. A monitoring system for environmental monitoring, comprising:
   a) a monitoring installation according to claim 1, and
   b) numerous electronic terminal units comprising a transmitter and a sensor for measurement of a measured value of an environmental variable that is potentially hazardous to health,
   wherein the transmitter is adapted to transmit the measured value to a monitoring installation.

16. The monitoring system according to claim 15, further comprising a direct data connection between at least one pair of the terminal units.

17. The monitoring system according to claim 16, wherein the direct data connection is a Bluetooth connection.

18. The monitoring system according to claim 16, wherein the direct data connection is a WLAN connection.

19. The monitoring system according to claim 16, wherein
   a) the terminal units transmit the measured values of the environmental variable via a mobile network to the monitoring installation, and
   b) the terminal units transmit the measured values in an event of missing network access to the mobile network via the direct data connection to another terminal unit with network access, the measured values being then transmitted from there via the mobile network to the monitoring installation.

20. The monitoring system according to claim 16, wherein the terminal units calibrate mutually via the direct data connection.

* * * * *